United States Patent [19]

Hong

[11] Patent Number: 5,352,619
[45] Date of Patent: Oct. 4, 1994

[54] METHOD FOR IMPROVING ERASE CHARACTERISTICS AND COUPLING RATIOS OF BURIED BIT LINE FLASH EPROM DEVICES

[75] Inventor: Gary Hong, Hsinchu, Taiwan

[73] Assignee: United Microelectronics Corporation, Hsinchu, Taiwan

[21] Appl. No.: 94,746

[22] Filed: Jul. 22, 1993

[51] Int. Cl.⁵ .......................................... H01L 21/266
[52] U.S. Cl. ...................................... 437/43; 437/191; 148/DIG. 114
[58] Field of Search ......................... 437/42, 43, 44, 49, 437/191, 193, 195, 968, 978, 979; 148/DIG. 43, DIG. 112, DIG. 114, DIG. 163

[56] References Cited

U.S. PATENT DOCUMENTS

| | | | |
|---|---|---|---|
| 4,780,424 | 10/1988 | Holler et al. | 437/29 |
| 5,010,028 | 4/1991 | Gill et al. | 437/43 |
| 5,021,848 | 6/1991 | Chiu | 437/43 |
| 5,075,245 | 12/1991 | Woo et al. | 437/43 |
| 5,077,230 | 12/1991 | Woo et al. | 437/43 |
| 5,102,814 | 4/1992 | Woo | 437/43 |
| 5,106,772 | 4/1992 | Lai | 437/43 |

Primary Examiner—Brian E. Hearn
Assistant Examiner—Chandra Chaudhari
Attorney, Agent, or Firm—George O. Saile

[57] ABSTRACT

A new method of obtaining a consistent controllable tunnel oxide near the source/drain edge of a contactless memory cell is described. A thick gate oxide layer is grown on a semiconductor substrate. A first polysilicon layer is deposited overlying the gate oxide layer. A silicon nitride layer followed by a silicon oxide layer are deposited overlying the first polysilicon layer. The silicon oxide, silicon nitride, and first polysilicon layers are patterned and etched. Arsenic ions are implanted through the gate oxide layer into the substrate to form buried source and drain bit lines within the substrate. A second layer of silicon nitride is deposited over the patterned layers and anisotropically etched to form sidewall spacers. SATO (self-aligned thick oxide) oxidation is performed over the N+ area. The nitride spacers are etched away whereby a portion of the gate oxide underlying the spacers is exposed. The silicon oxide layer is removed along with the exposed gate oxide. The thin tunnel oxide is regrown in the region where the nitride spacers were removed. The nitride layer is removed followed by deposition of a second layer of polysilicon overlying the first polysilicon layer. This layer is patterned such that it is overlying the SATO area to form the floating gate. An interpoly dielectric layer is deposited followed by a third polysilicon layer, deposited and patterned to form the control gate completing formation of the memory cell.

24 Claims, 3 Drawing Sheets

METHOD FOR IMPROVING ERASE CHARACTERISTICS AND COUPLING RATIOS OF BURIED BIT LINE FLASH EPROM DEVICES

BACKGROUND OF THE INVENTION

1. Field of the Invention

The invention relates to a method of fabricating semiconductor memory devices employing floating gates, and more particularly, to a method of improving erase characteristics and coupling ratios of semiconductor memory devices employing floating gates.

2. Description of the Prior Art

One class of semiconductor memory devices employ floating gates; that is, gates which are completely surrounded by an insulating layer, such as a silicon oxide. The presence or absence of charge in the floating gates represent binary information. These are called electrically programmable readonly memories (EPROM). EEPROMS are erasable electrically programmable read only memories. "Flash" memory devices are those in which all of the cells can be erased in a single operation. A buried bit line Flash EPROM/EEPROM has the advantage of smaller cell size when compared with conventional Flash cells because the buried bit line structure is contactless. However, a major problem with the buried bit line Flash cell is the unexpected performance of flash erase characteristics. This is believed to result from the non-uniform thin tunnel oxide thickness near the source edge, as noted in U.S. Pat. No. 4,780,424 to Holler et al.

Several methods have been proposed to improve the erase characteristics of the buried bit line process. U.S. Pat. Nos. 5,106,772 to Lai, 5,077,230 and 5,075,245 both to Woo et al., and 5,012,814 to Woo describe methods of using thin nitride, short reoxidation, or using no sacrificial oxide. These are still rough processes which may produce devices which are inconsistent in erase characteristics from lot to lot. U.S. Pat. No. 5,106,772 uses polysilicon deposition immediately after tunnel oxide growth to maintain the quality of the oxide, but it cannot avoid the birds-beak encroachment of thicker oxide into the thin tunnel oxide area near the source/drain edge so that the source/drain junctions will be under the non-uniform birds-beak region.

SUMMARY OF THE INVENTION

A principal object of the present invention is to provide an effective and very manufacturable method of obtaining consistent flash erase characteristics in a contactless memory cell.

Another object of the present invention is to provide a method of obtaining fast flash erase characteristics in a contactless memory cell.

Yet another object of the invention is to provide a method of providing an improved coupling ratio in the fabrication of a contactless memory cell.

In accordance with the objects of this invention a new method of obtaining a consistent controllable tunnel oxide near the source/drain edge of a contactless memory cell is achieved. A thick gate oxide layer is grown on a semiconductor substrate. A first polysilicon layer is deposited overlying the thick gate oxide layer. A silicon nitride layer is deposited overlying the first polysilicon layer and a silicon oxide layer is deposited over the silicon nitride layer. The silicon oxide, silicon nitride, and first polysilicon layers are patterned and etched. Arsenic ions are implanted through the thick gate oxide layer into the substrate to form source and drain buried bit lines within the substrate. A second layer of silicon nitride is deposited over the patterned silicon oxide, silicon nitride, and first polysilicon layers and anisotropically etched to form spacers on the sidewalls of the patterned silicon oxide, silicon nitride, and first polysilicon layers. SATO (self-aligned thick oxide) oxidation is performed over the N+ area. The silicon nitride spacers are etched away whereby a portion of the said thick gate oxide underlying the spacers is exposed. The silicon oxide layer is removed along with the exposed thick gate oxide. The thin tunnel oxide is regrown in the region where the silicon nitride spacers were removed. The silicon nitride layer is removed followed by deposition of a second layer of polysilicon overlying the first polysilicon layer. The second polysilicon layer is patterned such that it is overlying the SATO area to form the floating gate. A layer of ONO (silicon oxide-silicon nitride-silicon oxide) is deposited over the floating gate. A third polysilicon layer is deposited and patterned to form the control gate, or word line completing formation of the memory cell.

BRIEF DESCRIPTION OF THE DRAWINGS

In the accompanying drawings forming a material part of this description, there is shown.

DESCRIPTION OF THE PREFERRED EMBODIMENTS

Figure 1:
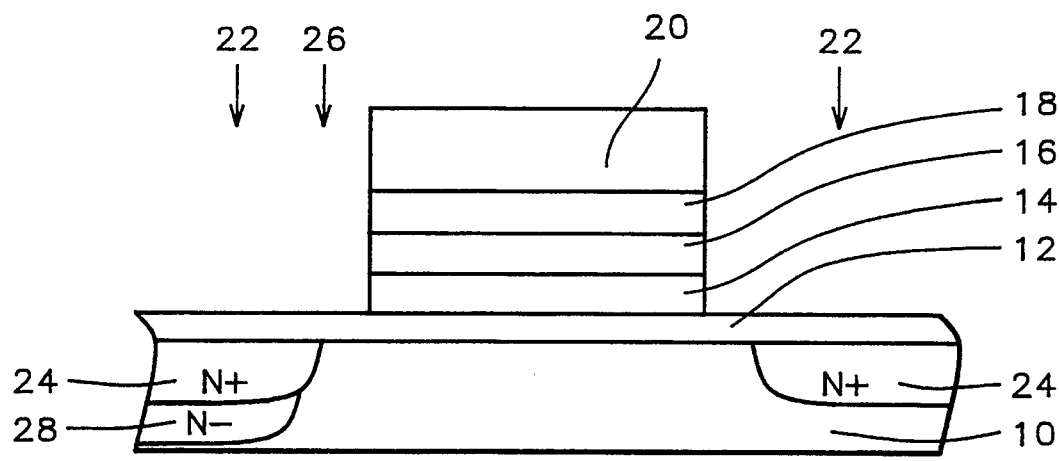
FIGS. 1 through 4 schematically illustrate in cross-sectional representation a preferred embodiment of the present invention.

Referring now more particularly to FIG. 1, the process of the present invention will be described. A portion of a partially completed integrated circuit is illustrated in FIG. 1 consisting of a semiconductor substrate 10, preferably composed of monocrystalline silicon. A thick gate oxide layer 12 is grown on the surface of the semiconductor substrate. The gate oxide thickness is between about 150 to 500 Angstroms and preferably about 200 Angstroms. A layer of polysilicon 14 is deposited by low pressure chemical vapor deposition (LPCVD) overlying the gate oxide 12. The polysilicon layer 14 has a thickness of between about 500 to 1000 Angstroms and is doped. A layer of silicon nitride 16 is deposited by LPCVD to a thickness of between about 500 to 1000 Angstroms overlying the polysilicon layer 14. This is followed by a layer of silicon oxide 18 deposited by chemical vapor deposition to a thickness of between about 200 to 1000 Angstroms.

A layer of photoresist is deposited and patterned to form a mask 20. The layers 14, 16, and 18 are etched away in the regions not covered by the photomask 20 using a conventional dry etching method. The photomask 20 is stripped. The layers 14, 16, and 18 shield the regions not to be doped as Arsenic ions 22 are implanted to form the buried bit lines 24. Arsenic ions are implanted at a dosage of between about 1 E 15 to 5 E 15 atoms/cm$^2$ and energy of between about 50 to 100 Kev.

Optionally, a source side only phosphorus implant 26 may be performed at a dosage of between about 2 E 14 to 8 E 14 atoms/cm$^2$ and energy of between about 50 to 100 Kev. The N− phosphorus junction 28 is deeper than the N+ Arsenic junction, which will form a double-diffused (DD) structure. The Folwer-Noheim (F-N) tunneling erase through a DD junction will create a smaller substrate current; therefore, a DD junction is preferred in a high voltage circuit design. Subsequent figures will not show the optional N− phosphorus junction 28.

Figure 2:
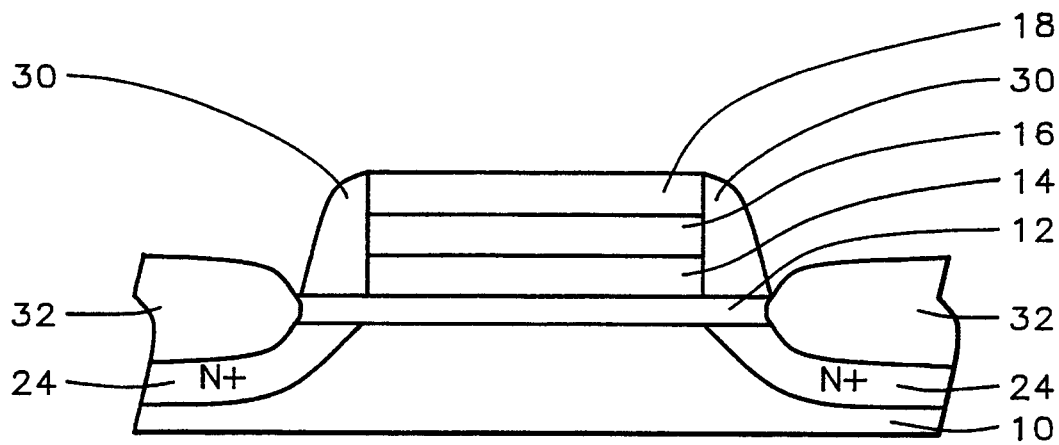

A second layer of silicon nitride is deposited over the substrate by LPCVD to a thickness of between about 1000 to 5000 Angstroms. The second silicon nitride layer is anisotropically etched using a conventional dry etcher leaving nitride spacers 30 on the sidewalls of the layers 14, 16, and 18, shown in FIG. 2. A self-aligned thick oxide (SATO) 32 is grown by thermal oxidation over the N+ source/drain regions at a temperature of about 875° C. for about 20 to 30 minutes in steam. The thermal oxide should be as thick as possible, but not so thick as to increase the N+ sheet resistance more than about 50 to 200 ohms per square, depending on the circuit. Then, the thickness of the SATO layer is between about 500 to 3000 Angstroms, depending upon the N+ sheet resistance consideration.

Figure 3:
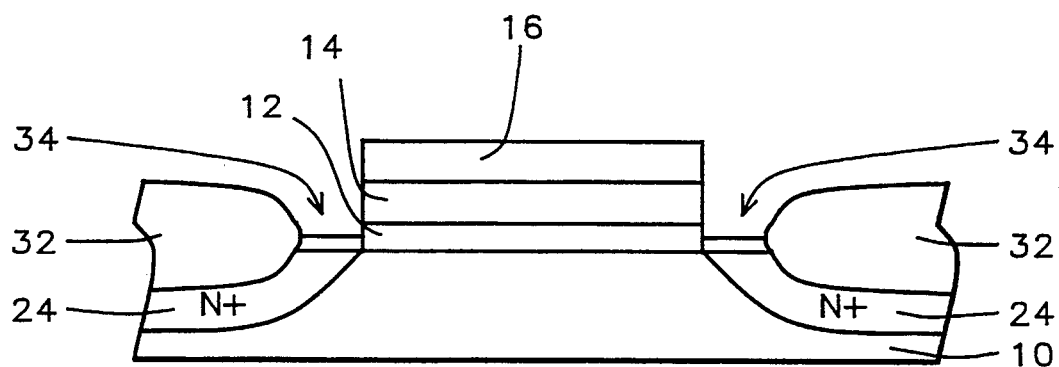

Referring now to FIG. 3, a wet etch is used to remove the silicon nitride spacers 30. This is typically done with phosphoric acid at between about 150° to 160° C. The thick gate oxide 12 under the spacers 30 is exposed when the spacers are etched away. A second wet etch using dilute hydrofluoric acid, for example a 10:1 buffered oxide etch (BOE), is used to remove the silicon oxide layer 18 and the exposed portion of the thick gate oxide 12.

A thin tunnel oxide 34 is regrown in the regions where the thick gate oxide was removed. The thin tunnel oxide is grown by conventional thermal oxidation, similar to the gate oxide growth, so that it is a "clean" oxide to a thickness of between about 60 to 120 Angstroms with a preferred thickness of about 100 Angstroms. The N+ source/drain area 24 is under the thin tunnel oxide 34 area. The thick birds-beak portion of the SATO 32 extends into the turn-on oxide area, but not into the portion at the critical edge of the source/drain area.

Figure 4:
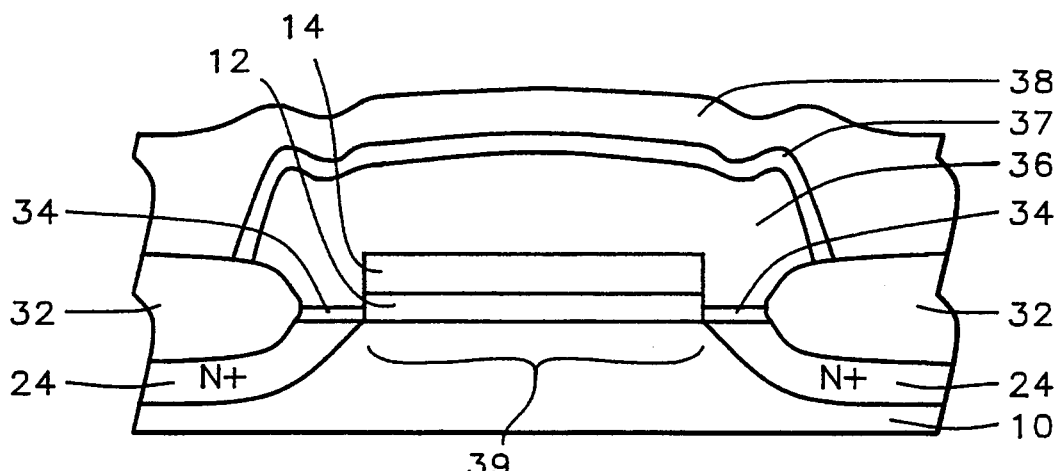

Referring now to FIG. 4, the remaining silicon nitride layer 16 is removed by a phosphoric acid etch. A second polysilicon layer 36 is deposited over the first polysilicon layer 14, the tunnel oxide areas 34, and SATO regions 32. This polysilicon layer 36 is doped and patterned to form the floating gate together with polysilicon layer 14. Polysilicon layer 36 is patterned such that it is overlying the SATO areas so as to increase the coupling ratio of the cell. The larger the area of the floating gate, the larger the coupling ratio. An interpoly dielectric 37, such as ONO (silicon oxide-silicon nitride-silicon oxide) is deposited over the polysilicon layer 36. A third polysilicon layer 38 is deposited over the dielectric 37. This third polysilicon layer is patterned to form a word line which serves as the control gate of the memory cell. Alternately, this word line 38 may be of a polycide composition.

The method of the present invention provides a consistent controllable tunnel oxide near the source/drain edge. This allows for better, fast and consistent, flash erase characteristics for contactless memory cells. In addition, the tunnel oxide of this invention will be only near the source/drain edge instead of the whole channel area (illustrated by 39 in FIG. 4) which will improve yield and reliability of the device. This smaller area of tunnel oxide is fabricated in a consistent, self-aligned method using spacer technology.

Figure 5:
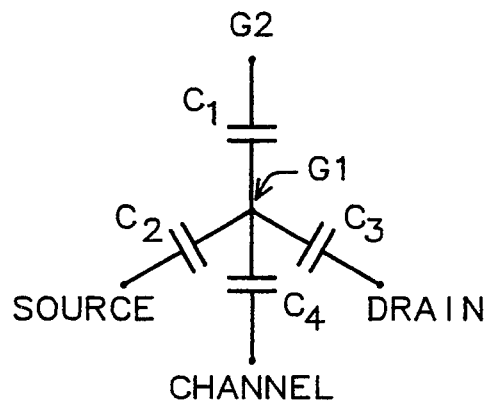
FIG. 5 schematically illustrates in cross-sectional representation the capacitances associated with the cells of an EPROM.

Moreover, because most of the channel area 39 can have a thicker gate oxide 12, the flash memory cell will have a better coupling ratio. Referring now to FIG. 5, the capacitance relationships of the memory cell are described. The floating gate G1 forms a capacitor with the control gate G2 and with the source, drain, and channel. The coupling ratio is represented by the following equation:

$$CR = \frac{C1}{C1 + C2 + C3 + C4}$$

where CR is the coupling ratio,
C1 is the coupling capacitance between G1 and G2,
C2 is the coupling capacitance between G1 and the source,
C3 is the coupling capacitance between G1 and the drain, and
C4 is the coupling capacitance between G1 and the channel.

As the channel gate oxide thickness increases, the coupling capacitance between the floating gate and the channel (C4) decreases; therefore, the coupling ratio increases.

Figure 6:
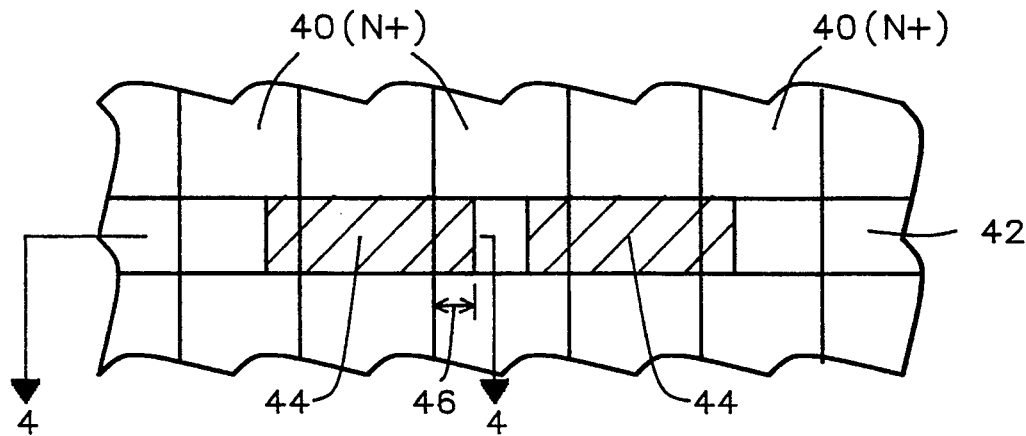
FIG. 6 illustrates a top view of the memory cell of the present invention.

Referring now to FIG. 6, there are illustrated buried bit lines 40 and word line 42 which forms the control gate of the memory cell. Floating gates 44 are shown. 46 indicates the polysilicon extension over the SATO area. This extension 46 can be reduced for a required coupling ratio so as to achieve a smaller cell size. The completed schematic view of FIG. 4 is seen in top view in FIG. 6.

Figure 7:
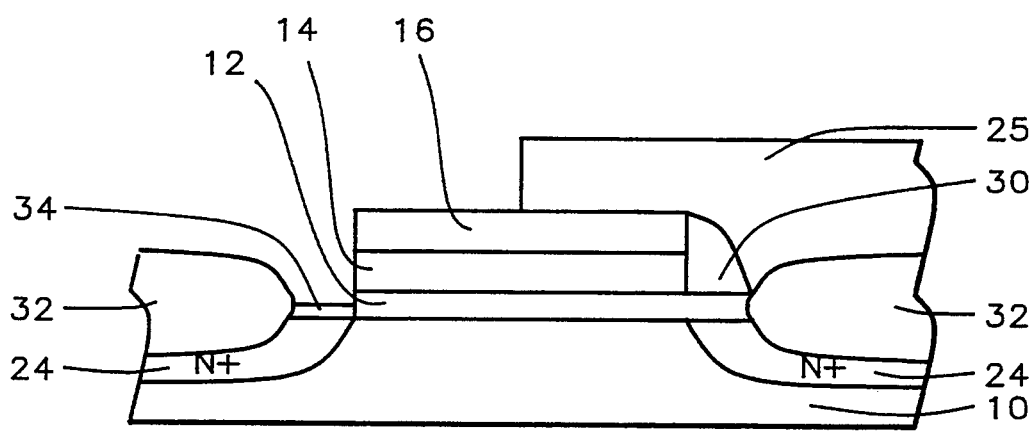
FIGS. 7 and 8 illustrate in cross-sectional representation a second preferred embodiment of the present invention.
Figure 8:
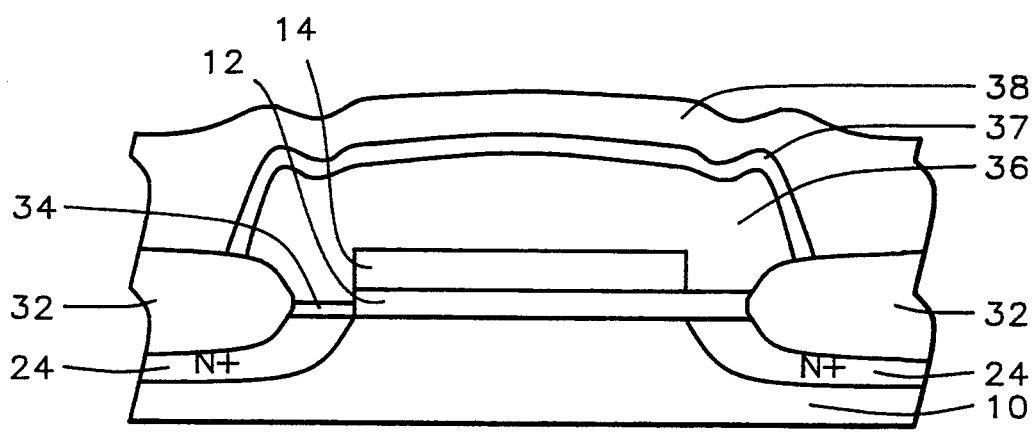

Referring now to FIG. 7, a second preferred embodiment of the invention will be described. The thin tunnel oxide may be fabricated only on the source side of the memory cell if the source and drain are not interchangeable in the design. A smaller thin tunnel oxide area is critical to the reliability of the oxide. Also, the coupling ratio will be better where more of the thick gate oxide can be used. Processing begins as described for the first embodiment until the nitride spacer removal. After the SATO regions 32 are grown, a photomask 25 is formed on the drain side of the device. Processing continues as before except that because of the photomask 25, the nitride and oxide wet etches will remove the nitride spacer 30 and the thick gate oxide 12 under the spacer 30 only on the source side of the device. The thin tunnel oxide 34 is regrown on the source side only as well. The memory cell is completed as in the first embodiment and as shown in FIG. 8 with floating gate 36, interpoly dielectric 37, and control gate 38. The difference is that in this embodiment the thin tunnel oxide 34 appears above the source region only. The thick gate oxide 12 extends over the drain region.

While the invention has been particularly shown and described with reference to the preferred embodiments thereof, it will be understood by those skilled in the art that various changes in form and details may be made without departing from the spirit and scope of the invention.

What is claimed is:

1. The method of forming a contactless memory cell wherein said memory cell has a consistent controllable tunnel oxide near the source/drain edge comprising:

providing a thick gate oxide layer of between about 150 to 500 Angstroms on a semiconductor substrate;

depositing a first polysilicon layer overlying said thick gate oxide layer;

depositing a silicon nitride layer overlying said first polysilicon layer;

depositing a silicon oxide layer overlying said silicon nitride layer;

patterning and etching said silicon oxide, silicon nitride, and first polysilicon layers;

implanting ions through said thick gate oxide layer into said substrate to form buried bit lines within said substrate wherein said buried bit lines act as source and drain regions;

depositing a second layer of silicon nitride over said patterned silicon oxide, silicon nitride, and first polysilicon layers and anisotropically etching said second silicon nitride layer to form spacers on the sidewalls of said patterned silicon oxide, silicon nitride, and first polysilicon layers overlying the edges of said source and drain buried bit lines;

growing an oxide layer on the surfaces of said substrate over said buried bit line regions;

removing said silicon nitride spacers whereby the portion of said thick gate oxide underlying said spacers is exposed;

removing said silicon oxide layer and said exposed portion of said thick gate oxide whereby said substrate is exposed in the areas underlying said removed portion of said thick gate oxide;

regrowing a tunnel oxide on said exposed areas of said substrate wherein said tunnel oxide has a consistent and controllable thickness and wherein said tunnel oxide is grown at said source and drain edges;

removing said silicon nitride layer;

depositing a second layer of polysilicon overlying said first polysilicon layer;

patterning said second layer of polysilicon to form a floating gate wherein said second polysilicon layer is patterned such that the edges of said floating gate overlie said oxide layer;

depositing an interpoly dielectric layer over said patterned second polysilicon layer; and depositing and patterning a third layer of polysilicon to form the control gate of the completed memory cell.

2. The method of claim 1 wherein said first polysilicon, silicon nitride, and silicon oxide layers have a combined thickness of between about 500 to 3000 Angstroms.

3. The method of claim 1 wherein said ion implantation is done with Arsenic ions at a dose of between about 1 E 15 to 5 E 15 atoms/cm$^2$ and energy of between about 50 to 100 Kev.

4. The method of claim 1 wherein after said buried bit line ion implantation, phosphorus ions are implanted into the source side only of said substrate at a dosage of between about 2 E 14 to 8 E 14 atoms/cm$^2$ and energy of between about 50 to 100 Kev.

5. The method of claim 1 wherein said second silicon nitride layer is deposited to a thickness of between about 1000 to 5000 Angstroms.

6. The method of claim 1 wherein said oxide layer is grown by a self-aligned oxidation method to a thickness of between about 500 to 3000 Angstroms.

7. The method of claim 1 wherein said removal of said silicon nitride spacers is done by anisotropic dry etching.

8. The method of claim 1 wherein said removal of said silicon oxide layer is done by a wet etching in dilute hydrofluoric acid.

9. The method of claim 1 wherein said tunnel oxide is grown to a thickness of between about 60 to 120 Angstroms.

10. The method of claim 1 wherein said second layer of polysilicon is deposited by low pressure chemical vapor deposition to a thickness of between about 500 to 3000 Angstroms.

11. The method of claim 1 wherein said interpoly dielectric layer is composed of silicon oxide-silicon nitride-silicon oxide.

12. The method of claim 1 wherein said third layer of polysilicon is deposited by low pressure chemical vapor deposition to a thickness of between about 500 to 3000 Angstroms.

13. The method of forming a contactless memory cell wherein said memory cell has a consistent controllable tunnel oxide at the source edge comprising:

providing a thick gate oxide layer of between about 150 to 500 Angstroms on a semiconductor substrate;

depositing a first polysilicon layer overlying said thick gate oxide layer;

depositing a silicon nitride layer overlying said first polysilicon layer;

depositing a silicon oxide layer overlying said silicon nitride layer;

patterning and etching said silicon oxide, silicon nitride, and first polysilicon layers;

implanting ions through said thick gate oxide layer into said substrate to form buried source and drain regions within said substrate;

depositing a second layer of silicon nitride over said patterned silicon oxide, silicon nitride, and first polysilicon layers and anisotropically etching said second silicon nitride layer to form spacers on the sidewalls of said patterned silicon oxide, silicon nitride, and first polysilicon layers overlying the edges of said buried source and drain regions;

growing an oxide layer on the surfaces of said substrate over said buried source and drain regions;

forming a photomask over the drain side of said substrate;

removing said silicon nitride spacer on the source side of said substrate only whereby the portion of said thick gate oxide underlying said removed spacer is exposed;

removing said photomask over said drain side of said substrate;

removing said silicon oxide layer and said exposed portion of said thick gate oxide whereby said substrate is exposed in the area underlying said removed portion of said thick gate oxide;

regrowing a tunnel oxide on said exposed area of said substrate wherein said tunnel oxide has a consistent and controllable thickness and wherein said tunnel oxide is grown at said source edge;

removing said silicon nitride layer;

depositing a second layer of polysilicon overlying said first polysilicon layer;

patterning said second layer of polysilicon to form a floating gate wherein said second polysilicon layer is patterned such that the edges of said floating gate overlie said oxide layer;

depositing an interpoly dielectric layer over said patterned second polysilicon layer; and depositing and patterning a third layer of polysilicon to form the control gate of the completed memory cell.

14. The method of claim 13 wherein said first polysilicon, silicon nitride, and silicon oxide layers have a combined thickness of between about 500 to 3000 Angstroms.

15. The method of claim 13 wherein said ion implantation is done with Arsenic ions at a dose of between about 1 E 15 to 5 E 15 atoms/cm$^2$ and energy of between about 50 to 100 Kev.

16. The method of claim 13 wherein after said buried source and drain region ion implantation, phosphorus ions are implanted into the source side only of said substrate at a dosage of between about 2 E 14 to 8 E 14 atoms/cm$^2$ and energy of between about 50 to 100 Kev.

17. The method of claim 13 wherein said second silicon nitride layer is deposited to a thickness of between about 1000 to 5000 Angstroms.

18. The method of claim 13 wherein said oxide layer is grown by a self-aligned oxidation method to a thickness of between about 500 to 3000 Angstroms.

19. The method of claim 13 wherein said removal of said silicon nitride spacer is done by anisotropic dry etching.

20. The method of claim 13 wherein said removal of said silicon oxide layer is done by a wet etching in dilute hydrofluoric acid.

21. The method of claim 13 wherein said tunnel oxide is grown to a thickness of between about 60 to 120 Angstroms.

22. The method of claim 13 wherein said second layer of polysilicon is deposited by low pressure chemical vapor deposition to a thickness of between about 500 to 3000 Angstroms.

23. The method of claim 13 wherein said interpoly dielectric layer is composed of silicon oxide-silicon nitride-silicon oxide.

24. The method of claim 13 wherein said third layer of polysilicon is deposited by low pressure chemical vapor deposition to a thickness of between about 500 to 3000 Angstroms.

* * * * *